(12) United States Patent  (10) Patent No.: US 9,204,514 B2
Steinle et al.  (45) Date of Patent: Dec. 1, 2015

(54) LASER DIODE CONTROL DEVICE

(75) Inventors: Gunther Steinle, Munich (DE); Christian Jenkner, Klagenfurt (AT)

(73) Assignee: Lantiq Beteiligungs-GmbH & Co.KG, Neubiberg (DE)

( * ) Notice: Subject to any disclaimer, the term of this patent is extended or adjusted under 35 U.S.C. 154(b) by 0 days.

(21) Appl. No.: 13/269,500

(22) Filed: Oct. 7, 2011

(65) Prior Publication Data

US 2012/0263202 A1 Oct. 18, 2012

(30) Foreign Application Priority Data

Oct. 8, 2010 (EP) .................................... 10187032

(51) Int. Cl.
| H01S 5/026 | (2006.01) |
| H05B 33/08 | (2006.01) |
| H01S 5/068 | (2006.01) |
| H01S 5/00 | (2006.01) |
| H01S 5/042 | (2006.01) |

(52) U.S. Cl.
CPC ........ H05B 33/0851 (2013.01); H01S 5/06804 (2013.01); H01S 5/0014 (2013.01); H01S 5/0021 (2013.01); H01S 5/042 (2013.01)

(58) Field of Classification Search
CPC . H01S 5/0021; H01S 5/0617; H01S 5/06804; H01S 5/0683

USPC ............... 372/29.01, 29.011, 29.015, 38.01, 372/38.02, 38.07; 315/309; 712/23
See application file for complete search history.

(56) References Cited

U.S. PATENT DOCUMENTS

| 5,334,826 | A | * | 8/1994 | Sato et al. ................ 235/462.06 |
| 5,659,782 | A | * | 8/1997 | Senter et al. .................... 712/23 |
| 7,106,763 | B2 | * | 9/2006 | Tan et al. .......................... 372/9 |
| 2002/0190666 | A1 | | 12/2002 | Sakamoto | |
| 2002/0196595 | A1 | | 12/2002 | Ciancio | |
| 2008/0079371 | A1 | * | 4/2008 | Kang et al. .................... 315/309 |
| 2008/0205460 | A1 | * | 8/2008 | Okaniwa et al. ......... 372/29.015 |
| 2010/0219774 | A1 | * | 9/2010 | Bianco et al. .................. 315/309 |

FOREIGN PATENT DOCUMENTS

EP 0431832 A2 6/1991

* cited by examiner

*Primary Examiner* — Yuanda Zhang
*Assistant Examiner* — Michael Carter (57) ABSTRACT

A laser control device comprises a driver circuitry for supplying a drive current to a laser diode (LD). The device further comprises a digital storage for storing drive current values for a plurality of temperature conditions, and a central processing unit coupled to the digital storage for controlling the driver circuitry in accordance with the drive current values from said digital storage. The central processing unit is configured for multiple updating the drive current values stored in the digital storage.

11 Claims, 11 Drawing Sheets

| Lookup Table for Start Values | | | |
|---|---|---|---|
| Temp | Ibias=I0 | Imod=I1-I0 | Laser Age at Update |
| 223 | x | x | x |
| ..... | x | x | x |
| 227 | x | x | x |
| ..... | x | x | x |
| 373 | x | x | x |

| Temp | Derived Laser Reference Parameters | | |
|---|---|---|---|
| | SE µW/ma | Ith µA | Laser Age at Update |
| 223 | Extrapol. | Extrapol. | - |
| ...... | x | x | x |
| 227 | Interpol | Interpol. | - |
| ...... | x | x | x |
| 373 | Extrapol. | Extrapol. | - |

LASER DIODE CONTROL DEVICE

PRIORITY

This Application claims benefit of EP Patent Application 10187032.7, which was filed on Oct. 8, 2010. The entire contents of the EP Patent Application are incorporated herein by reference.

BACKGROUND

Laser diodes are used as transmitter elements in fiber optic communications systems such as e.g. PONs (Passive Optical Networks). Laser light power is required to remain on constant levels for logical zero and logical one during operation. However, the characteristics of laser diodes show strong temperature dependence. Further, they are subject to variations during aging. Therefore, the drive current of a laser diode has to be controlled to achieve constant levels of light power during operation.

Since the temperature of the laser diode and the drive current required to attain a certain level of light power do not have a linear relationship, it is difficult to design a control circuit that implements accurate control. Typically, a monitor diode is used to monitor the output power of the laser diode and the drive current of the laser diode is controlled in feedback loop operation to provide for constant power laser output.

A drive current regulation based on feedback control needs a convergence time to reach steady state drive current conditions. The convergence time may cause information loss in the optical network. Since control data such as e.g. header data defining the destination of a message is frequently transmitted at the beginning of laser operation, a short convergence time of the feedback control laser driver may be essential for a high data throughput in the communications system.

Further, laser diode aging is a threat to the stability of an optical network. Since drifts of the laser diode drive current due to aging are non-deterministic, sudden variations of drive current may occur. Further, variations of the drive current due to aging and variations of the drive current due to temperature effects can often not be separated during drive current feedback control.

SUMMARY OF THE INVENTION

According to one implementation, a laser control device comprises a driver circuitry for supplying a drive current to a laser diode, a digital storage for storing drive current values for a plurality of temperature conditions, and a central processing unit coupled to the digital storage for controlling the driver circuitry in accordance with drive current values from said digital storage and for multiple updating the drive current values stored in the digital storage.

By updating the drive current values over laser diode lifetime, the stored drive current values used to control the driver circuitry may be modified to improve the quality of regulation. As a result, the laser diode control may be faster and more reliable over the whole lifetime of the diode. Further, the updated drive current values may account for laser diode aging.

In one embodiment, the driver circuitry is configured to output actual drive current values used to update the drive current values stored in the digital storage. Such update procedure may implement a function of self-learning of laser driver regulation quantities.

In one embodiment, the central processing unit may be configured to update the drive current values upon predetermined timer events. Basically, the predetermined timer events may be regularly distributed over time. In one embodiment the timer events may be configurable in order to account for non-linear aging.

In one embodiment the driver circuitry comprises a closed-loop control circuit for generating the drive current, and the central processing unit is configured to update the drive current values based on a signal indicative of a regulation quality of the closed-loop control circuit. By way of example, the signal indicative of a regulation quality of the closed-loop control circuit may be computed on the basis of an actual convergence time and/or on the basis of an actual control deviation of the closed-loop control circuit.

In one embodiment the laser diode control device further comprises an old data digital storage for storing old drive current values obtained upon a former operation of the laser diode. These old drive current values may be protected from being overwritten, i.e. are hold available by the old data digital storage over the whole lifetime of the laser diode. Thus, laser diode aging may be evaluated by comparing the updated drive current values stored in the digital storage and the old drive current values stored in the old data digital storage. By way of example, the old drive current values may comprise drive current values obtained during an initial operation of the laser diode.

In one embodiment the central processing unit is capable of deriving laser diode characteristic parameters from the drive current values stored in the digital storage. Laser diode characteristic parameters may be indicative of a slope efficiency (SE) and/or a threshold current (Ith) of the laser diode.

In one embodiment, the laser control device may comprise a diode parameter digital storage for storing a chronological list of laser diode characteristic parameters.

In one embodiment, the central processing unit may be configured to derive a quantity indicative of laser diode aging based on an evaluation data stored in the chronological list of laser diode characteristic parameters. That way, an operator has the possibility of an comprehensive and early access to reliability of the laser diode. By way of example, based on the quantity indicative of laser diode aging, maintenance plans or replacement tasks may be efficiently scheduled in advance. For instance, an early warning can be generated before the end of life of the laser diode is actually reached.

BRIEF DESCRIPTION OF THE DRAWINGS

These and further embodiments of the invention will be described by way of example with respect to the accompanying drawings. Other embodiments and many of the intended advantages of embodiments will be readily appreciated by reference to the following description.

DESCRIPTION

Figure 1:
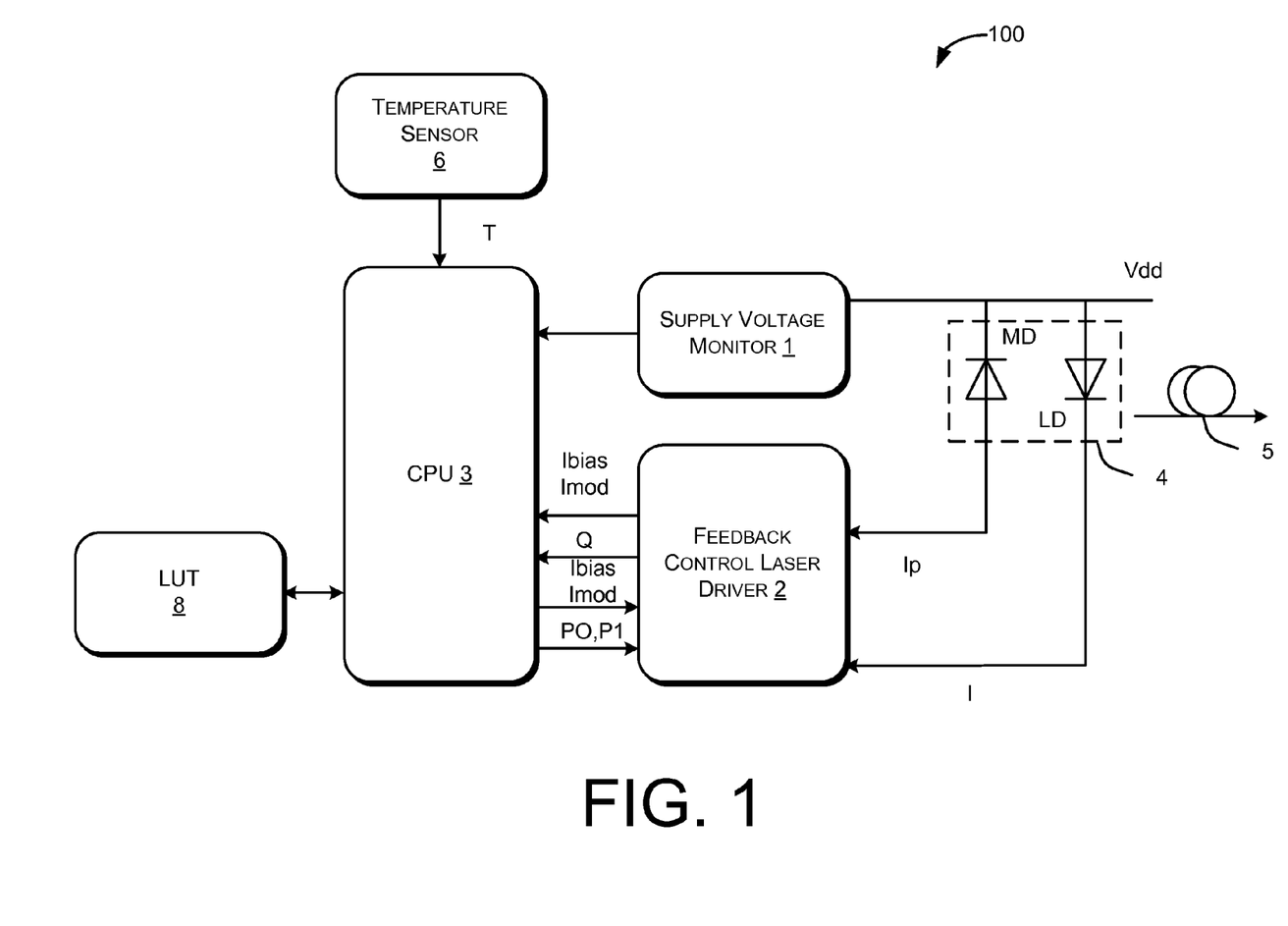
FIG. 1 is a block diagram of a laser control device connected to a laser module according to one embodiment of the present invention.

As shown in FIG. 1, according to one embodiment of the invention, a laser control device may comprise an optional supply voltage monitor 1, a feedback control laser driver 2, a central processing unit (CPU) 3 and a digital storage device storing a look-up table (LUT) 8.

A laser module 4 may comprise a laser diode LD and a monitor diode MD. A supply voltage Vdd is connected to the laser module 4. The laser diode LD is driven by a drive current I controlled by the feedback control laser driver 2. The monitor diode MD is illuminated by part of the output light of the laser diode LD and generates a monitor current Ip indicative of the optical power P emitted by the laser diode LD. Typically, the laser diode LD is connected to an optical fibre 5 for light transmission in an optical network, e.g. a passive optical network (PON).

The CPU 3 may receive temperature data T from a temperature sensor 6 and voltage data V generated by the supply voltage monitor 1. Further, the CPU 3 may receive data on the bias current Ibias and on the modulation current Imod actually used by the feedback control laser driver 2 to drive the laser diode LD. Optionally, the CPU 3 may receive a quality signal Q indicative of a regulation quality of the feedback control laser driver 2.

The feedback control laser driver 2 is equipped with a closed-loop control circuit. The closed-loop control circuit controls the drive current I such that a predetermined, constant output power P0 is obtained when the laser diode LD is driven by Ibias to produce a logical zero output and/or such that a predetermined constant optical output power P1 is obtained when the laser diode LD is driven by a drive current Ibias+Imod to produce a logical one output. To this end, the current Ip produced by the monitor diode MD may be compared to predetermined monitor current target values D0 (when the drive current I0=Ibias is controlled) and/or D1 (when the drive current I1=Ibias+Imod is controlled) and the respective drive current I0 and/or I1 is varied to reduce the deviation between Ip and D0 and/or D1, respectively, to zero. Thus closed-loop regulation provides for constant optical power outputs P0, P1, and in general, temperature and aging effects are compensated by the closed-loop control circuit implemented in the feedback control laser driver 2.

The feedback control laser driver 2 is controlled by the CPU 3. More specifically, the feedback control laser driver 2 may be supplied with data on drive currents Ibias and/or Imod (or equivalent current data such as e.g. I0 and I1) to control the closed-loop control circuit implemented in the feedback control laser driver 2. Further, monitor current target values D0, D1 of the monitor current Ip may optionally be transmitted from the CPU 3 to the feedback control laser driver 2. Drive current data Ibias and/or Imod and (optionally) monitor current target values D0, D1 may be read out from the LUT 8 connected to the CPU 3. Further, as will be explained in more detail further below, data on actual drive current values Ibias, Imod reported by the feedback control laser driver 2 to the CPU 3 may be written into the LUT 8 in course of a LUT update operation.

In one embodiment, the closed-loop control circuit is a dual loop control circuit controlling both power levels P0 and P1. In another embodiment, a single loop control circuit may be used, which either controls the power level P0 or the power level P1. In this case, the other power level is regulated in accordance with the closed-loop controlled power level.

Figure 2:
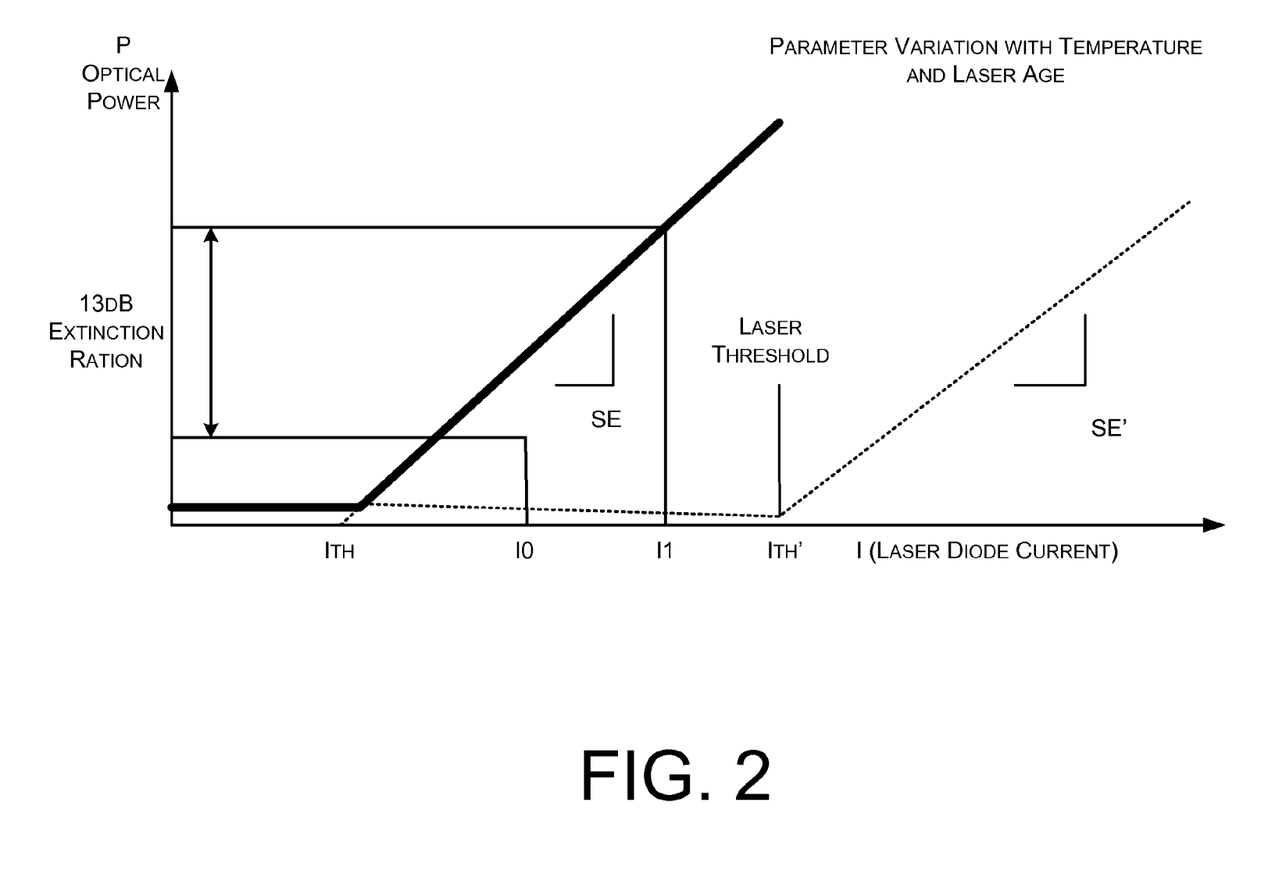
FIG. 2 is a graph schematically illustrating characteristic curves of the optical output power P versus the laser diode drive current I.

FIG. 2 is an explanatory graph illustrating curves of the optical output power P versus the laser diode drive current I. The logical power level P0 corresponding to logical 0 is obtained at drive current I0 and the logical power level P1 corresponding to logical 1 is obtained at drive current I1. The curve between P0 and P1 is close to a straight line and the slope of this line is referred to as slope efficiency (SE). Thus, SE is defined by $$SE=(P1-P0)/Imod \qquad (1),$$

with Imod=I1−I0.

The intersection of the straight line running through P0 and P1 and the I-axis is given by $$Ith=Ibias-P0/SE \qquad (2).$$

And defines the threshold current Ith. The slope efficiency SE and the threshold current Ith are characteristic parameters of the laser diode LD.

SE and Ith are subject to parameter variations with temperature and laser diode age. The dashed curve in FIG. 2 exemplifies the characteristic curve of a laser diode LD under changed temperature conditions and/or at a later stage in lifetime. Apparently, the current threshold Ith and the slope efficiency SE are significantly different from the corresponding values Ith and SE of the solid line curve of the laser diode LD.

Figure 3:
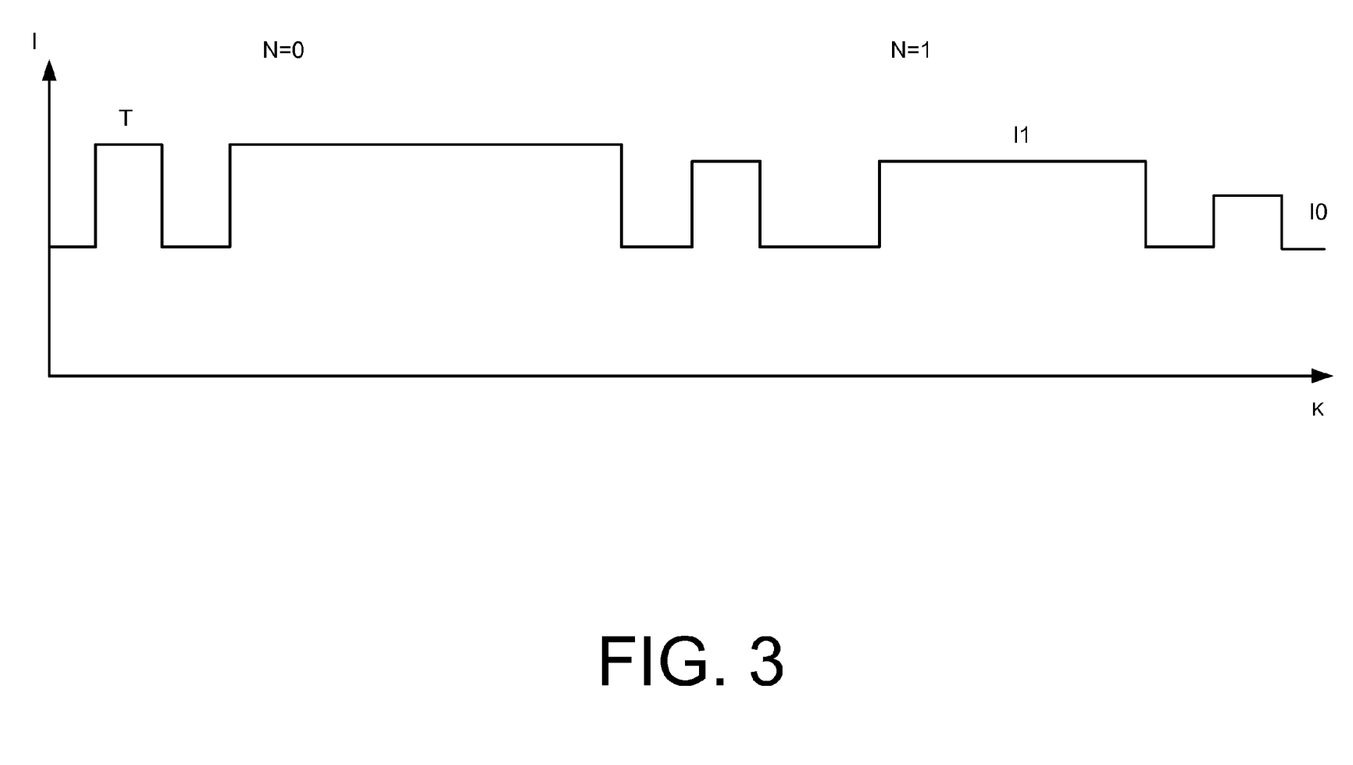
FIG. 3 is a graph illustrating the laser drive current I versus pulse time number k applied to the laser diode under feedback control operation.

FIG. 3 illustrates an exemplary operation of the feedback control laser driver 2. I denotes the laser diode drive current. The drive current I is a sequence of pulses of pulse level I1 (for logical 1) or pulse level I0 (for logical 0). The pulse number k is used as a time index. The pulse time is referred to as T.

In this example, the monitor diode MD is slower than the laser diode LD, and therefore, the time constant of the feedback loop is significantly greater than the pulse time T. Then, a certain number of consecutive identical digits (CID) of 1 and/or 0 are needed to resolve the accurate power level of P1 and/or P0. By way of example, in FIG. 3, a minimum number of six CID of 1 are needed to perform one feedback loop control step for I1. Feedback loop control steps are denoted by n. Given a pulse train as shown in FIG. 3, two feedback loop control steps n=0 and n=1 can be performed for I1 within the depicted time period.

As is apparent from FIG. 3, the feedback loop control steps n result in that the drive currents I0 and/or I1 are varied. For instance, if the output power P1 of the laser diode at drive current I1 is measured to be greater than the power target value (i.e. the monitor diode current Ip is greater than the monitor current target value D1), I1 is decreased after successive control loop steps n=0, 1, . . . . Analogously, I0 may be controlled (not shown in FIG. 3). I0 may be controlled by a feed-forward control based on the feedback control of I1 or in a second, independent feedback control loop using monitor diode current Ip at output power P0 (measured at CIDs of logical 0) and monitor current target value D0.

It is to be noted that the occurrence probability of a certain CID is dramatically reduced with its length. Therefore, it is important to allow for short length CID and to need as few CID events as possible for tracking the output power P in order to converge the output power levels P0 and/or P1 fast enough to the target output power levels, e.g. faster than one transmission burst. Otherwise, the specified target output power levels or the specified extinction ratio window (see FIG. 2) could be missed leading to information loss in the optical network.

Figure 4:
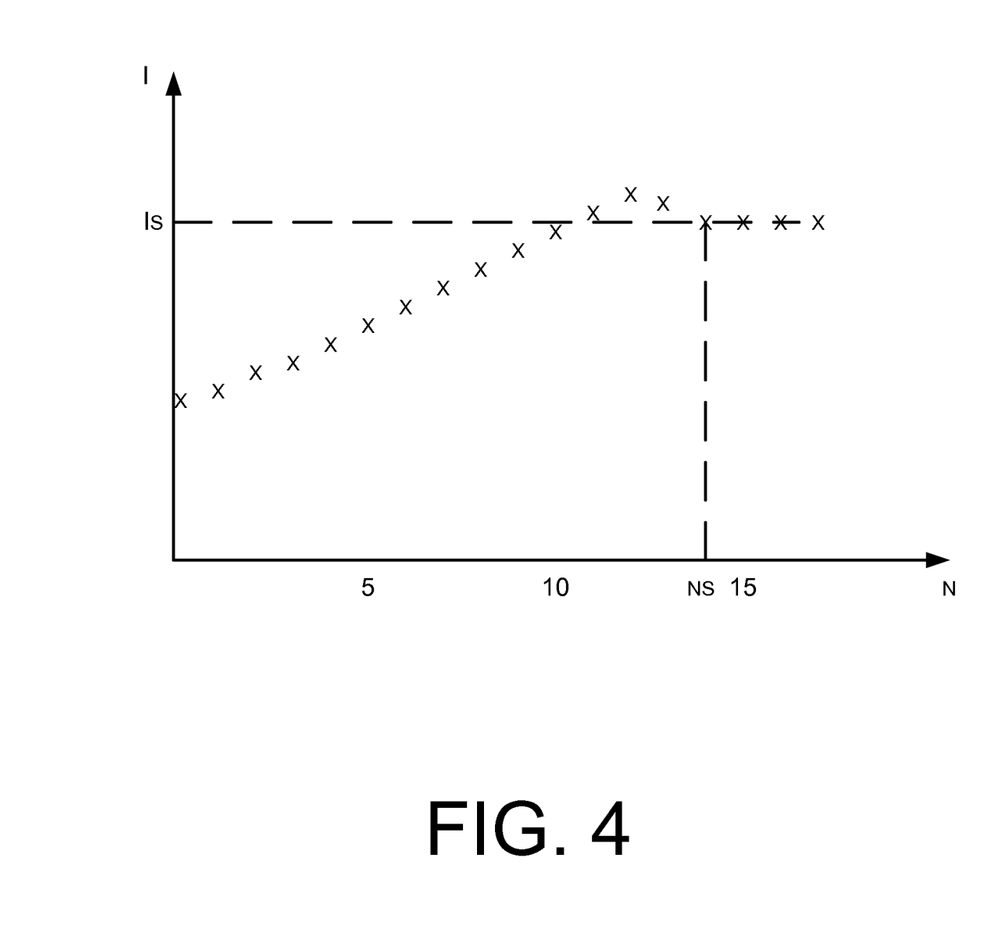
FIG. 4 is a graph illustrating the transient response of laser diode feedback control for a first start drive current value.
Figure 5:
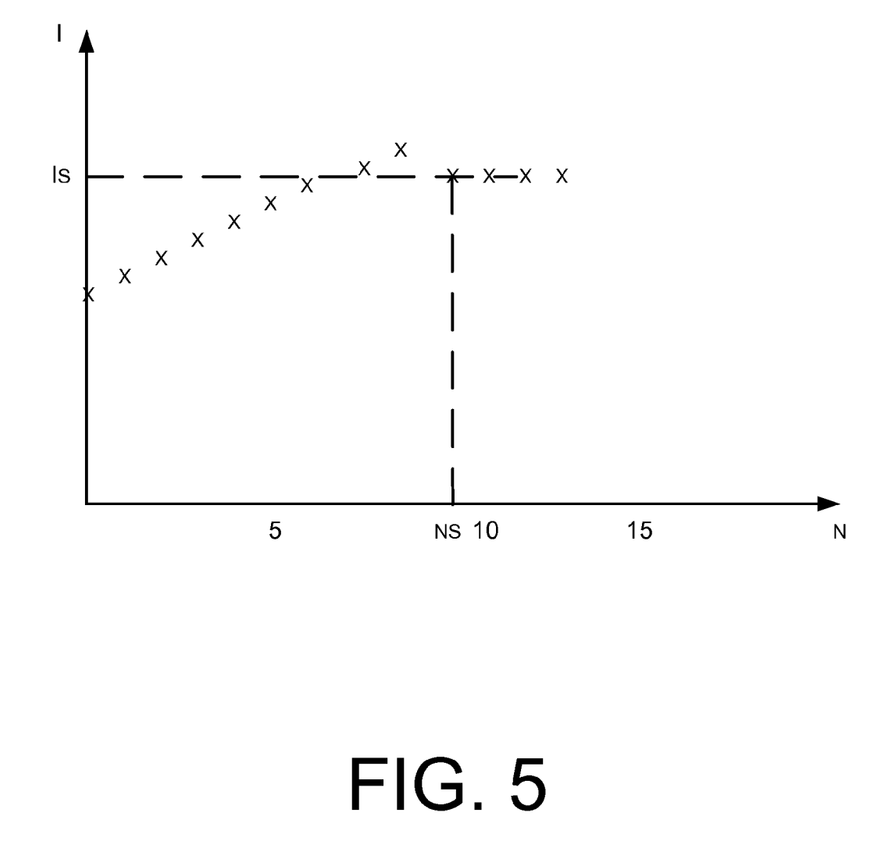
FIG. 5 is a graph illustrating the transient response of laser diode feedback control for a second start drive current value.

FIGS. 4 and 5 illustrate the convergence of closed-loop operation of the feedback control laser driver 2. In FIG. 4, a start value I(n=0) (corresponding to either I0(n=0) or I1(n=0)) of the laser drive current I is used at the beginning of closed-loop feedback operation. As the output power P(n=0) measured at the first CID (i.e. n=0) is too small, I(n=1) in control loop step n=1 is increased. Steady state closed-loop operation is reached at ns=14. The steady state value of the laser drive current I is denoted by Is, with Is=I(n>=14). The greater the value of ns, the larger is the convergence or transient time of the control loop.

The value of ns significantly depends on the start value I(n=0). The smaller the initial control deviation Is—I(n=0), the shorter is the convergence time of the control loop needed to reach the steady state value Is of the laser drive current I. This is exemplarily illustrated in FIG. 5, where the initial control deviation Is−I(n=0) is smaller than in FIG. 4 and steady state operation is already reached at ns=9, i.e. at the $9^{th}$ occurrence of a CID.

It is to be noted that the closed-loop control circuit may even fail to reach steady state operation if the start value I(n=0) is too far from Is. In this case, after an unsuccessful convergence attempt, the capture range of the control loop operation must be increased, which greatly increases the convergence time until steady state closed-loop operation is reached.

According to one aspect of the invention, the CPU 3 controls the feedback control laser driver 2 in a manner that reduces the initial control deviation and thus the convergence time of the closed-loop control circuit to a minimum. This is e.g. achieved by constantly updating the data Ibias and/or Imod or other data indicative of feedback control start values transferred from the CPU 3 to the feedback control laser driver 2.

These start current values Ibias, Imod (or other feedback control start values) may be constantly updated based e.g. on a quality level of the regulation itself. If the regulation exhibits bad quality Q (e.g. large initial control deviation and/or long convergence time or no convergence at all), the current start values used in the feedback control laser driver 2 are updated. To this end, more appropriate current start values Ibias, Imod are read from LUT 8 and are used to program the feedback control laser driver 2 by CPU 3. That way, whenever the regulation quality Q falls below a certain threshold, the feedback control laser driver 2 may be reprogrammed to improve regulation quality.

Reprogramming of the feedback control laser driver 2 by start current values Ibias, Imod may be initiated other way. For example, it is also possible to use configurable timer events distributed over the lifetime of the laser diode LD to reprogram the feedback control laser driver 2 by CPU 3. That way, variations due to aging may be tracked.

On the other hand, the CPU 3 is configured to continually write qualified regulation results of the laser drive current I to LUT 8. That is, actual values of Ibias and/or Imod (or equivalent drive current values) are measured in the feedback control laser driver 2 and monitored by the CPU 3. Under the control of the CPU, these values are stored in LUT 8 together with laser operation time data.

Figure 6:
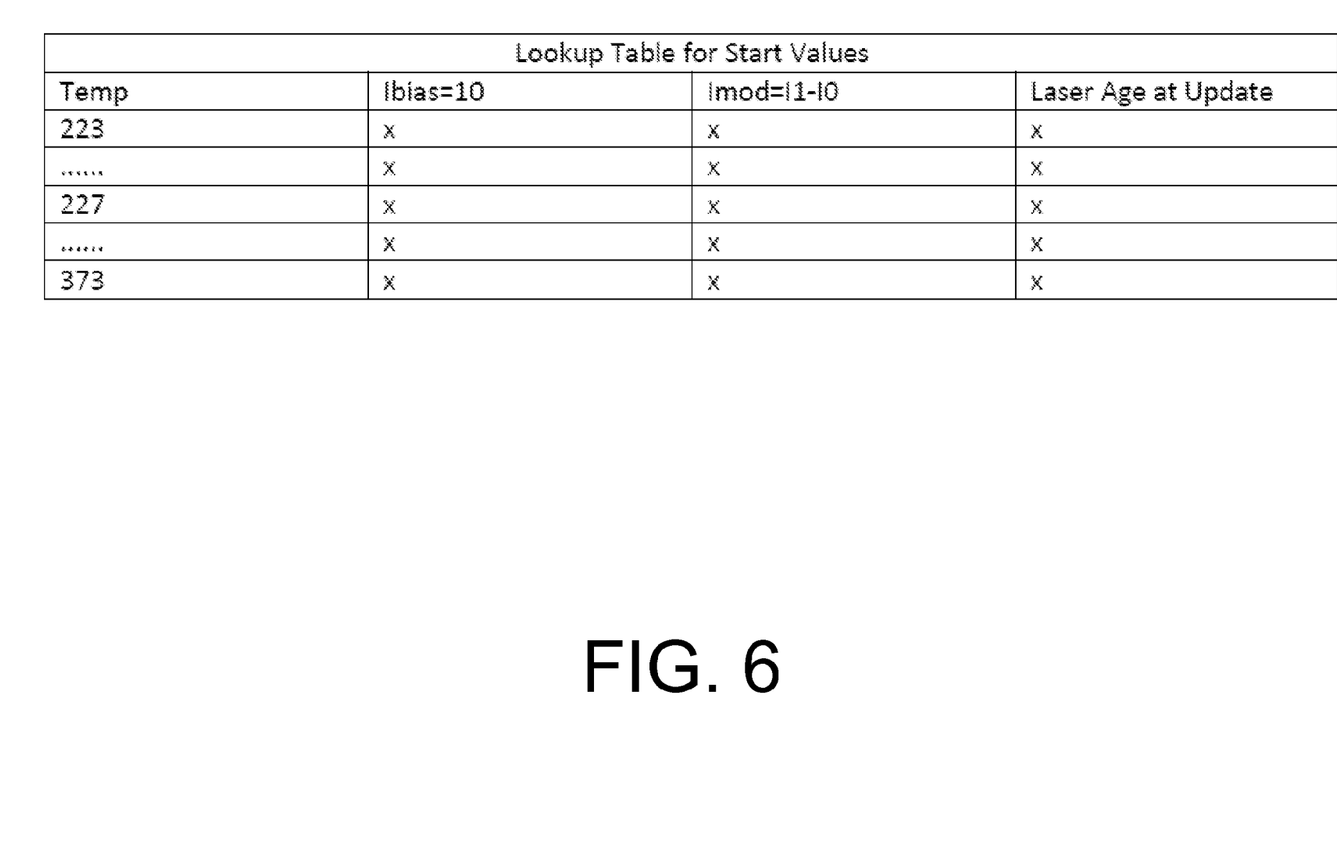
FIG. 6 is a diagram illustrating data stored in a drive current look-up table according to one embodiment of the invention.

FIG. 6 is a diagram illustrating by way of example data stored in LUT 8 according to one embodiment of the invention. Each data set written in a row may comprise temperature data, drive current data (e.g. Ibias, Imod) and data of laser age at update.

In one embodiment, old entries in LUT 8 are overwritten upon update. That is, only one data set for each temperature corresponding to the actual or most recent measurement result is stored in LUT 8. Thus, in this embodiment, LUT 8 represents an actual drive current value digital storage.

In one embodiment, the CPU 3 is configured to interpolate and/or extrapolate drive current data over temperature in order to have always optimum guess values of drive current data for all temperatures. For instance, each time actual drive current data measured at a specific temperature is to be entered, the CPU 3 may start an interpolation/extrapolation procedure to derive interpolated/extrapolated drive current data for LUT updating.

In one embodiment, at least part of old entries in LUT 8 are protected from being overwritten to represent chronological data. By way of example, old measurement data and old interpolation/extrapolation data from a first measurement at the start date of operation of the laser diode LD is maintained in LUT 8. In this case, LUT 8 may contain at least two sets of data for each temperature, namely old operation data and actual (i.e. updated) operation data. Further, the chronological data may also include multiple sets of old data for each temperature recorded at intermediate times between the first measurement and the most recent measurement from which the actual data is derived.

Thus, in one embodiment, LUT 8 in FIG. 1 may represent an actual drive current value digital storage for updated, actual data. Or, in another embodiment, LUT 8 in FIG. 1 may represent an actual drive current value digital storage for updated, actual data and an old drive current value digital storage for protected, chronological data in combination.

If one or more sets of chronological drive current data for each temperature are stored in LUT 8, aging of the laser diode may be tracked.

Figure 7:
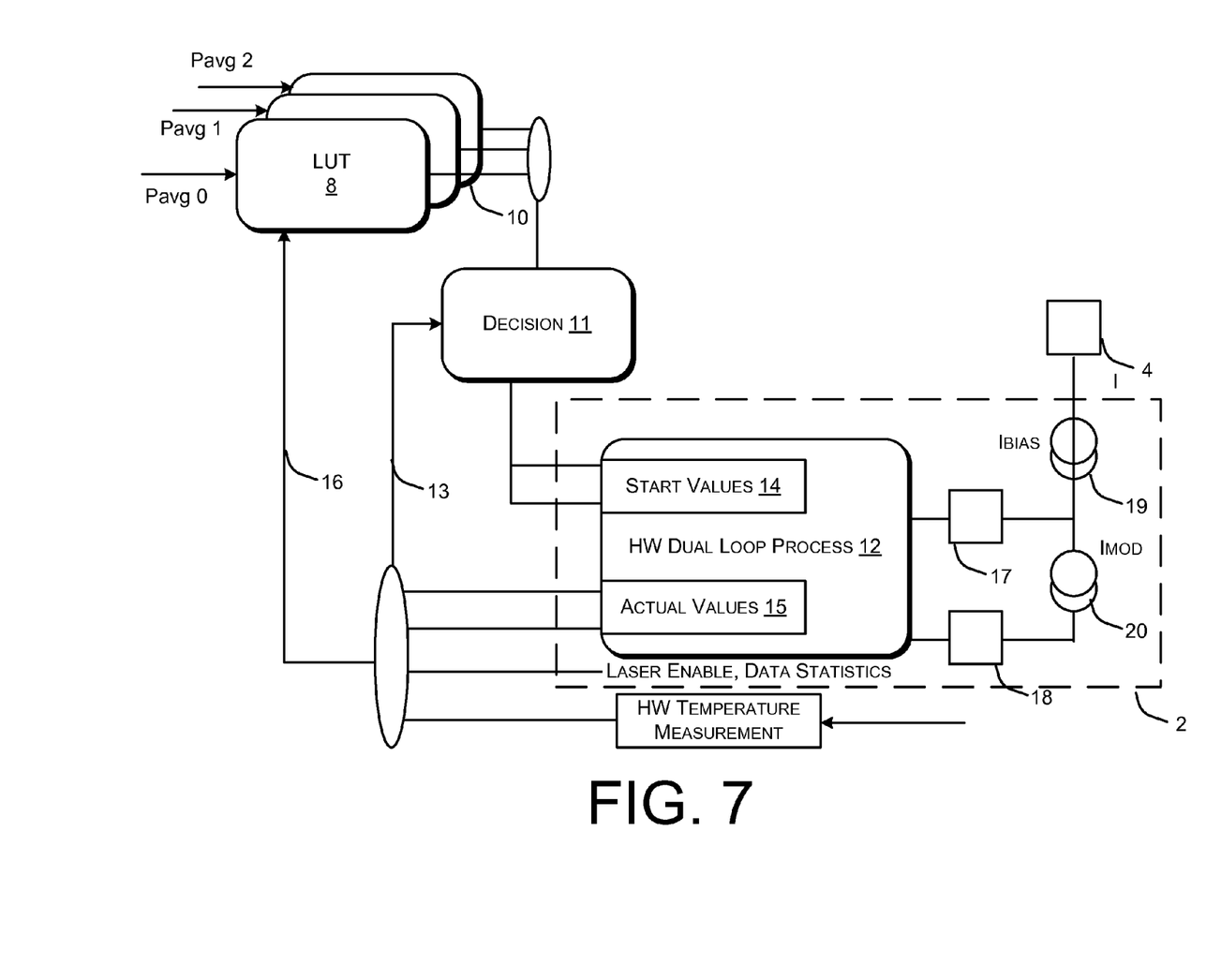
FIG. 7 is a data flow diagram on block level corresponding to the embodiment shown in FIG. 1.

FIG. 7 is a representation for explaining the operation of the control circuit shown in FIG. 1 on a block level data flow description. As previously mentioned in conjunction with FIG. 6, LUT 8 contains data sets of laser drive currents Ibias and Imod corresponding to different temperatures. Here, by way of example, a plurality of LUTs 8 is provided, with each LUT 8 containing the laser driver current and temperature values for a specific laser diode average output power Pavg0, Pavg1 and Pavg2, respectively. If only one laser diode average output power Pavg0 is needed, one LUT 8 is sufficient.

At 10, the values of Ibias and Imod associated with the desired laser diode average output power Pavg0, Pavg1 or Pavg2 are read out of the LUT 8. Further, target current values D0 (corresponding to Ibias) and D1 (corresponding to Ibias+Imod) of the monitor diode MD may be obtained by reading out the LUT 8 associated with the appropriate laser diode average output power Pavg0, Pavg1 or Pavg2.

The read out values of Ibias, Imod are subjected to a decision operation 11. In the decision operation 11 it is decided whether data read out of the LUT 8 is used for subsequent feedback-loop controlled laser diode operation. To this end, actual values of Ibias and Imod stored in an actual value buffer 15 of the closed-loop control circuit 12 of the feedback control laser driver 2 are provided via data link 13 to the decision operation 11. Typically, the closed-loop control circuit 12 is implemented in hardware (HW). The decision operation 11 will be explained in more detail in the flowchart of FIG. 8 further below. If the decision operation 11 decides that new start current values should be used for laser diode operation, the values read out of the LUT 8 are written as new start current values into a start value buffer 14 of the closed-loop control circuit 12. Then, the next feedback loop operation is based on these new start values and the actual value buffer 15 is updated when the closed-loop control circuit 12 has reached steady state condition. If the decision operation 11 decides that the actual start current values stored in the actual value buffer 15 should be maintained, no write operation to the start value buffer 14 of the feedback loop control circuit hardware is performed.

Further, the decision operation 11 decides whether the laser drive current values of the LUT 8 are updated by actual drive current values. If the decision operation 11 decides that the laser drive current values hold in the LUT 8 should be updated, a write operation on the LUT 8 is performed to store actual laser drive current values Ibias and Imod from the actual value buffer 15 via data link 16 to the LUT 8. To this end, a measurement of hardware temperature T is performed in order to store the actual laser drive current values Ibias and/or Imod at the appropriate temperature entries (see FIG. 6) in LUT 8. Further, data indicative of the laser age at update may be stored in LUT 8.

If the decision operation 11 decides that LUT 8 shall not be updated by the actual laser drive current values, no write operation is performed on the LUT 8 via data link 16.

FIG. 7 further illustrates an exemplary implementation of the feedback control laser driver 2. The feedback control laser driver 2 may contain the HW closed-loop control circuit 12, a bias digital-to-analog converter (BIAS DAC) 17, a modulation digital-to-analog converter (MODULATION DAC) 18, a controllable current source 19 to produce Ibias and a controllable current source 20 to produce Imod. The HW closed-loop control circuit 12 may implement a HW dual loop process to provide a control signal for Ibias regulation and a control signal for Imod regulation. The control signals may be converted into the analog regime by DAC 17 and DAC 18, respectively, and the corresponding analog signals are used to control the current sources 19 and 20.

Figure 8:
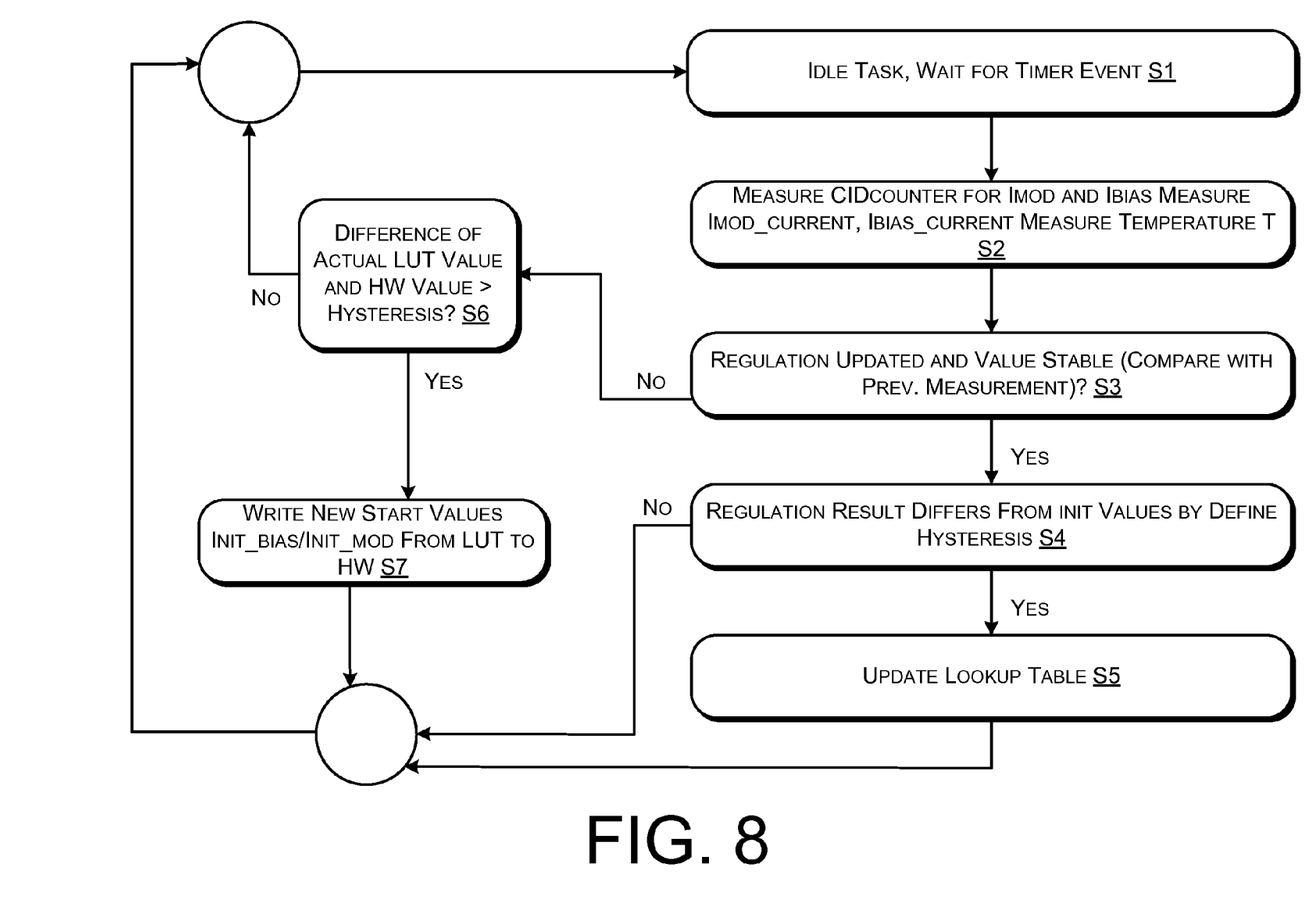
FIG. 8 is a flowchart illustrating an embodiment of a method of operation of the central processing unit for performing read and write accesses on the digital storage and the control circuit hardware.

FIG. 8 is a flowchart illustrating an embodiment of a method of operation of the CPU 3 concerning the decision operation 11. At step S1, an idle task waits for a timer event. Upon occurrence of the timer event, the idle task is abandoned and step S2 is initiated.

It may be the case that the laser control device 100 is activated upon the occurrence of the timer event to operate the laser module 4 to start data transmission operation. However, typically, the (software) timer event as well as the entire procedure illustrated in FIG. 8 is independent of the data transmission operation of the control device 100 and the laser module 4.

At step S2, initiated by the timer event, a CID counter for Imod and/or Ibias is measured and the actual drive currents Imod and/or Ibias are measured by reading out the actual value buffer 15. The CID counter indicates the actual number n of CID events. Still further, the actual temperature T is measured.

At step S3, it is checked whether the regulation is updated and stable. By way of example, the regulation may be considered updated and stable if the values n of CID counter for Imod and/or Ibias are smaller than predetermined limits and the difference between the actual measurement value of Imod and the previous measurement value of Imod and/or the difference between the actual measurement value of Ibias and the previous measurement value of Ibias are smaller than corresponding predetermined threshold values, respectively.

The regulation may be considered unstable if the values n of CID counter for Imod and/or Ibias are greater than predetermined limits and the difference between the actual measurement value of Imod and the previous measurement value of Imod and/or the difference between the actual measurement value of Ibias and the previous measurement value of Ibias are still greater than corresponding predetermined threshold values, respectively.

If I0 and I1 are controlled, ns(Ibias) may indicate the number of CID events needed to reach stable I0 after the ending of a data transmission pause or loss of steady state condition, and ns(Imod) may indicate the number of CID events needed to reach stable I1 after the ending of a data transmission pause or loss of steady state condition. Thus, ns is a measure of the actual convergence time of the respective hardware control loop(s). If ns(Ibias) and/or ns(Imod) are greater than corresponding limits, although the regulation become stable, the regulation may be considered not updated.

If the regulation is not stable or not updated, the quality Q of regulation may be considered low. In this case, the process advances to step S6. Alternatively, if the regulation is stable and updated, the quality Q of regulation may be considered high and the process advances to step S4.

It is to be noted that the above scheme, where the values n or ns of CID counter for Imod and Ibias and the fluctuations of the values of Imod and Ibias are used to decide on the quality Q of regulation, is exemplary. In general, also other quantities (e.g. the initial control deviation of I0 and/or I1) and different schemes as described in step S3 may be used to decide on the quality Q of regulation.

In step S4 it is checked whether the differences (or hysteresis) between the actually measured drive current values Imod and/or Ibias and the drive current values Imod and Ibias read out of the LUT 8 are smaller than appropriate threshold (or hysteresis) values. If yes, the process advances to step S5 and the LUT 8 is updated by the actual values Imod and Ibias. The write operation for updating the LUT 8 uses a write address computed on the basis of the measured temperature T and on the basis of the desired average output power, if multiple LUTs 8 for different average output powers Pavg0, Pavg1 or Pavg2 are available. As mentioned previously, LUT updating may be performed by overwriting the old drive current values Imod and Ibias or by maintaining the old drive current values as chronological data and adding the new drive current values Imod and Ibias as a new data set.

Further, the decision operation 11 of FIG. 7 decides on a write operation by which new start drive current values are written from LUT 8 to the start value buffer 14 in the closed-loop control circuit 12. If step S3 reveals that the regulation has not been updated or appears to be unstable, i.e. that the quality Q of feedback loop operation is low, the process advances to step S6. In step S6, it is checked whether a differences (or hysteresis) of the measured values Imod and/or Ibias stored in the actual value buffer 15 and the values Imod and/or Ibias read out from the LUT 8 are greater than appropriate threshold (or hysteresis) values. If yes, the drive current values Imod and Ibias which had been stored during the most recent update of LUT 8 are transferred from LUT 8 as new start values to the start value buffer 14, see step S7. In this case, the next data transmission operation is performed using the new start values Imod and/or Ibias read from the LUT 8. Again, measured temperature T is used to obtain stored values associated with the actual temperature, i.e. the address of the read operation from LUT 8 is calculated on the basis of the measured temperature T.

Step S5 (updating of LUT 8) and step S7 (programming of the control loop hardware with new start values) are continually performed over the lifetime operation of the laser diode LD and establish a self-learning scheme. As temperature varies and diode age increase, successive update values in step S5 are usually different to each other and successive programming values in step S7 are usually different to each other.

The decision operation 11 as well as the write and read accesses to LUT 8 and to closed-loop control circuit hardware 12 are performed by the CPU 3 under the control of a software program. Further, interpolation tasks to derive drive current values for temperatures between temperatures at which measured drive current values are available and extrapolation tasks to derive drive current values extrapolated to higher and lower temperatures relative to temperatures at which measured drive current values are available are performed by the CPU 3 under the control of the software program.

Typically, before the first installation of the system, LUT 8 may contain default values which have been defined during a production test of the respective laser diode module 4 at a few discrete temperatures. Then, upon a first operation of the system, the default drive current values are used and the LUT 8 is updated by actually measured drive current values as explained before. In one embodiment, these initial drive current values obtained during a first operation may be used as the values which are protected from being overwritten. These initial drive current values represent the laser diode characteristics at the time of installation of the system. The default values may be overwritten by these initial drive current values. In another embodiment, the default values defined during a production test of the laser diode module 4 may be used as the initial values which are protected from being overwritten in LUT 8.

During later lifetime operation of the system, drive current values Ibias, Imod written into the LUT 8 are constantly updated in accordance with the procedures explained before. Thus, a self-learning scheme is provided which guarantees that drive current values stored in the LUT 8 are always best to knowledge values. This self-learning approach guarantees high regulation quality and short convergence times or transients on each activation of the laser control device for data transmission.

Figure 9:
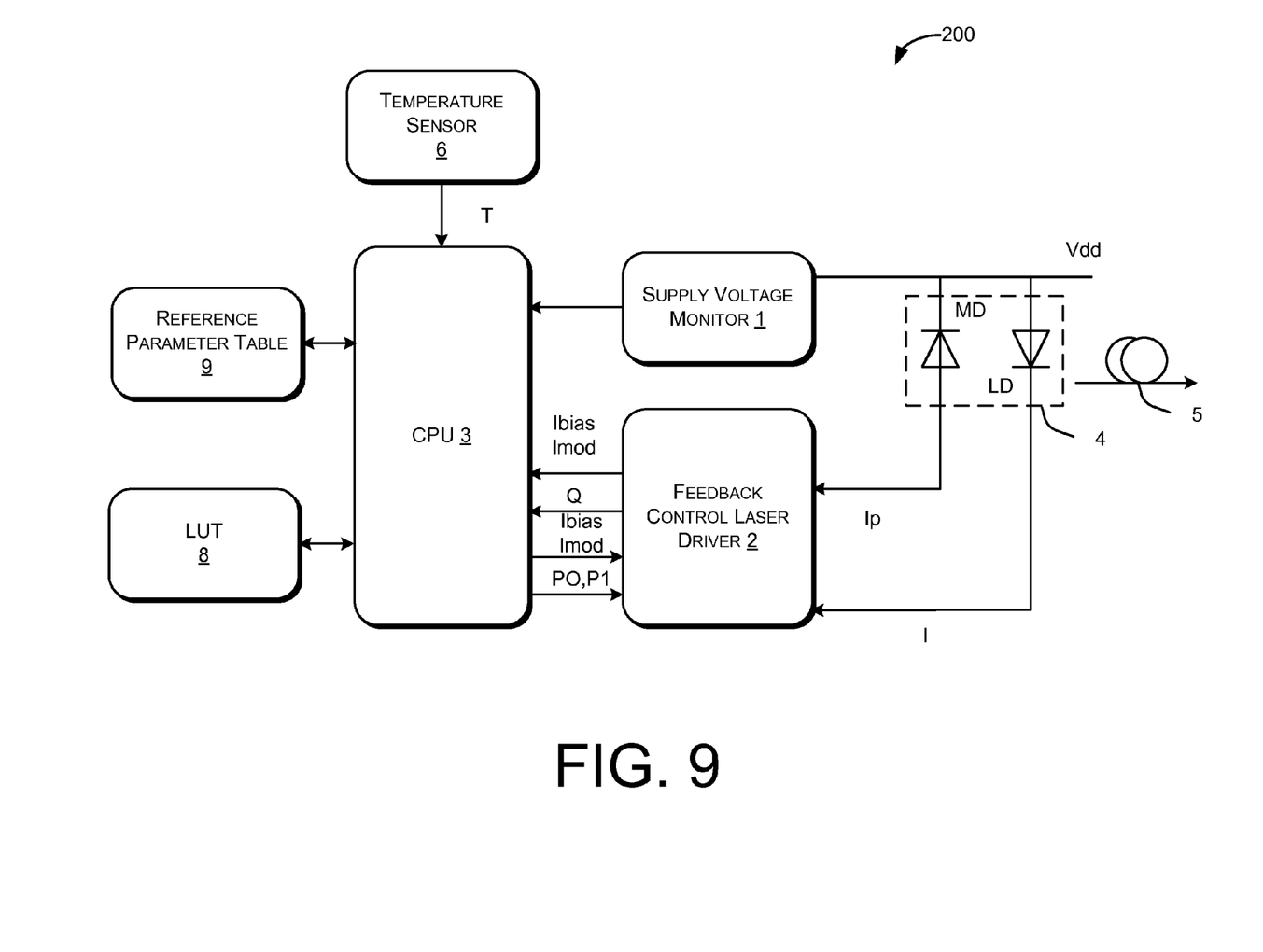
FIG. 9 is a block diagram of a laser control device connected to a laser module according to one embodiment of the invention.

FIG. 9 is a block diagram of a control circuit device 200 according to one embodiment of the invention. Like reference numerals designate corresponding similar parts. The control circuit device 200 is similar to the control circuit device 100, and reference is made to the description of the aforementioned embodiment in order to avoid reiteration. In FIG. 9, the CPU 3 is additionally coupled to a laser reference parameter table 9.

Figure 10:
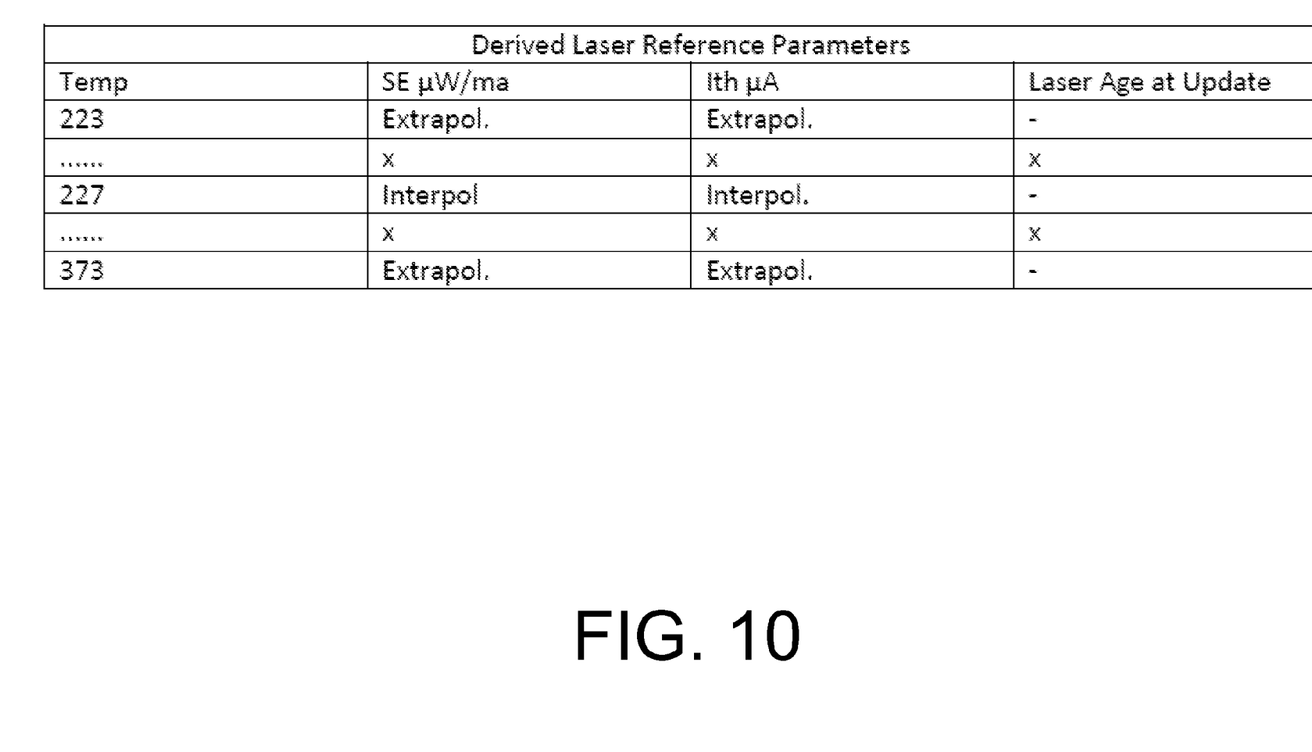
FIG. 10 is a diagram illustrating data stored in a diode parameter look-up table according to one embodiment of the invention.

FIG. 10 is a diagram illustrating data stored in the laser reference parameter table 9. Similar to LUT 8, each data set written in a row may comprise temperature data and data of laser age at update. However, rather than drive current data as stored in LUT 8, the laser reference parameter table 9 contains characteristic parameters of the laser diode. By way of example, SE in units of $\mu$W/mA and Ith in units of $\mu$A may be contained in each row of the laser reference parameter table 9. These characteristic parameters may be calculated from drive current data according to equations (1) and (2).

Note that the characteristic parameters SE and Ith are independent of average output power Pavg0, Pavg1, Pavg2. That is, even if a plurality of average output powers Pavg0, Pavg1, Pavg2 may be supported by the laser control device 200 and therefore, a plurality of LUTs 8 are provided, only one laser reference parameter table 9 is needed.

By way of example, in FIG. 10, characteristic parameters SE, Ith which are directly calculated from measured values of Ibias, Imod are indicated by x. Characteristic parameters SE, Ith at intermediate temperatures are interpolated. Characteristic parameters at temperatures lower or higher than the temperatures at which measured data is available are extrapolated. That way, the laser reference parameter table 9 at each time contains the best to knowledge characteristic laser parameters derived from actual drive current values Ibias, Imod measured in accordance with the foregoing description.

Figure 11:
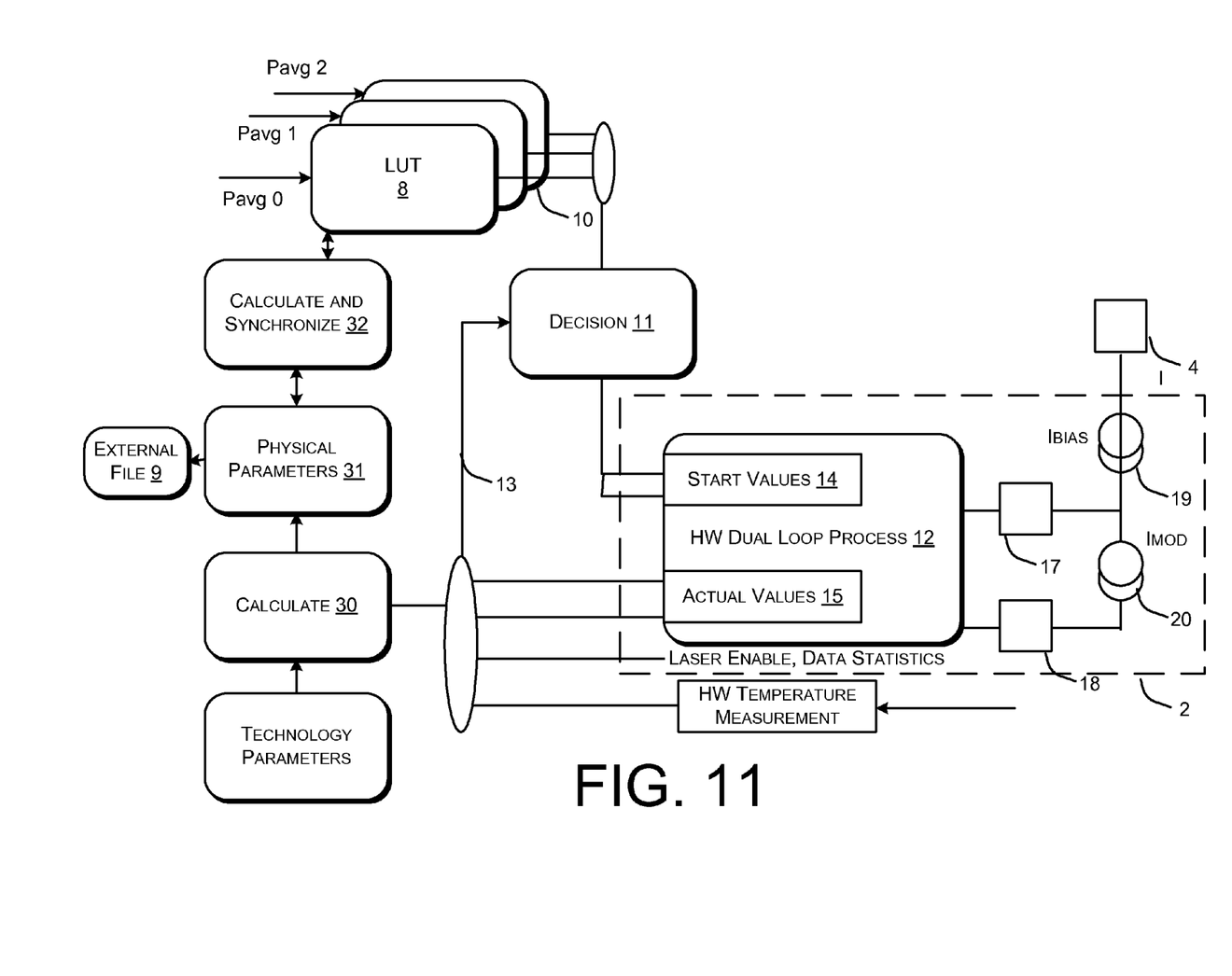
FIG. 11 is a data flow diagram on block level corresponding to the embodiment shown in FIG. 9.

FIG. 11 is a block level data flow representation similar to FIG. 7, however, related to the laser control device 200 according to the embodiment of FIG. 9. In order to avoid reiteration, reference is made to the description of FIG. 7. Here, actual laser diode current values Ibias and Imod from the actual value buffer 15 are subjected to a calculate operation 30 performed in CPU 3. The calculate operation 30 is used to derive characteristic parameters (referred to as physical parameters in FIG. 11) such as e.g. SE and Ith from the actual drive current values Ibias and Imod received from the feedback control laser driver 2. These characteristic parameters 31 are retransformed to drive current values by a calculate-and-synchronize operation 32 according to $$I\text{mod}=(P1-P0)/SE \tag{3}$$

and $$I\text{bias}=I\text{th}+P0/SE \tag{4}.$$

The drive current values Imod and Ibias generated by the calculate-and-synchronize operation 32 are written into LUT 8 as explained before. Again, LUT 8 is updated each time the decision operation 11 decides that actual drive current values 15 are to be output of the actual value buffer 15. The LUT 8 may be configured to overwrite previous drive current values which refer to the same temperature and to the same average output power Pavg0, Pavg1, Pavg2 on each table update. That is, LUT 8 may optionally store only the most actual data sets, and, in this embodiment, no chronological data sets (i.e. data sets to the same temperature with different times of laser age at update) are retained in LUT 8.

In one embodiment, chronological data may exclusively be stored in the laser reference parameter table 9 in form of the characteristic parameters of the laser diode LD. To this end, the calculate-and-synchronize operation 32 reads drive current values Ibias, Imod out from LUT 8, retransforms these values into characteristic parameters such as SE and Ith and stores these characteristic parameters in the laser reference parameter table 9.

The calculate-and-synchronize operation 32 to update the laser reference parameter table 9 may be configured to be independent of the LUT 8 update operation. By way of example, the laser reference parameter table 9 may be updated by the calculate-and-synchronize operation 32 on a regular time basis such as e.g. each one or plurality of hours, days, weeks or any other suitable time period. That way, by recording the characteristic parameters of the laser diode LD over lifetime, a chronological list of temperature-dependent characteristic parameters may be established in the laser reference parameter table 9. The aging of the laser diode LD may then be tracked by evaluating the chronological list of temperature-dependent characteristic parameters.

In one embodiment, all characteristic parameters written to the laser reference parameter table 9 are kept on record, that is are not overwritten by subsequent data. However, it is also possible to record only a limited number of data sets. For instance, in one embodiment, only two data sets per temperature may be recorded in the chronological list stored in the laser reference parameter table 9, namely an initial data set generated by the calculate-and-synchronization operation 32 at the first operation or installation of the laser diode LD and protected from being overwritten, and an actual data set which is overwritten at each activation of the calculate-and-synchronize operation 32. Thus, the file to which the chronological list is written may be used to protocol the full amount of history data or only a partial amount of the history data produced by the calculate-and-synchronize procedure 32.

The calculate operation 30, the calculate-and-synchronize operation 32 and the write accesses to the laser reference parameter table 9 are performed by the CPU 3 under control of a software program.

Further, the CPU 3 may be configured to analyze the data stored in the laser reference parameter table 9 to derive a quantity indicative of laser diode aging. To this end, in one embodiment, the initial characteristic parameter data recorded on a first operation or installation of the system is compared to actual characteristic parameter data stored during the most recent calculate-and-synchronize operation 32.

If the chronological list of laser diode characteristic parameters hold in the laser reference parameter table 9 contains more than two sets of data per temperature (i.e. more than the initial data set and the actual data set obtained at the most recent calculate-and-synchronize operation 32), the aging of the laser diode may be more closely tracked over the diode lifetime by additionally analyzing intermediate data of the list. Thus, in all embodiments, by comparing the actual measurement data with old (earlier or the first) measurement data and taking into account the difference of operating time, absolute and relative drifts of the drive current or characteristic parameters as well as drift rates can be exactly calculated for each temperature point and used to evaluate the laser diode aging.

The quantity indicative of laser diode aging based on an evaluation of the entries in the chronological list may be used to assess the reliability of the laser diode LD and to predict possible failure of the laser diode LD. Thus, besides gaining statistics and establishing correlations based on deployment details, it is possible to plan maintenance or replacement tasks efficiently in advance.

One skilled in the art will understand that one or more aspects of the embodiments may be practiced with a lesser degree of the specific details. Further, known structures and elements are described merely in schematic form in order to facilitate describing one or more aspects of the embodiments. Further, it should be noted that specific details of the various embodiments could be combined if not expressively excluded or impossible for physical reasons. In particular, the self-learning schemes used in the various embodiments as well as the procedures to assess the reliability of the laser diode on the basis of actual and old (i.e. history, chronological, protocol) laser diode data may be identical in all embodiments, and details thereof described in relation to one embodiment may be applied to all other embodiment.

What is claimed is:

1. A laser control device comprising:
    a driver circuitry to supply a drive current to a laser diode (LD), the driver circuitry configured to output actual drive current values indicative of an actual drive current supplied to the laser diode (LD),
    a digital storage to store drive current values for a plurality of temperature conditions, the drive current values associated with a lookup table, and
    a central processing unit coupled to the digital storage, the central processing unit to control the driver circuitry in accordance with the drive current values from the lookup table and to enable updating of at least one of the drive current values associated with the lookup table to provide an updated lookup table, wherein the driver circuitry comprises a closed-loop control circuit for regulating the drive current to the laser diode (LD), wherein the central processing unit is configured to update the drive current values associated with the lookup table based on an actual convergence time of the closed-loop control circuit.

2. The laser control device of claim 1, wherein the central processing unit is configured to update the drive current values associated with a lookup table over a lifetime of the laser diode (LD).

3. The laser control device of claim 1, wherein the central processing unit is configured to update the drive current values associated with the lookup table on the basis of the actual drive current values.

4. The laser control device of claim 1, further comprising an old data digital storage to store old drive current values obtained upon a previous operation of the laser diode (LD).

5. The laser control device of claim 4, wherein the central processing unit is configured to derive a quantity being indicative of laser diode aging on the basis of an evaluation of the drive current values associated with the lookup table and the old drive current values stored in the old data digital storage.

6. The laser control device of claim 1, wherein the central processing unit is configured to derive laser diode characteristic parameters from drive current values associated with a lookup table.

7. The laser control device of claim 1, wherein the central processing unit is configured to derive laser diode characteristic parameters on the basis of the actual drive current values output by the driver circuitry.

8. The laser control device of claim 1, further comprising a diode parameter digital storage to store a chronological list of laser diode characteristic parameters.

9. The laser control device of claim 8, wherein the central processing unit is configured to derive a quantity being indicative of laser diode aging based on an evaluation of data stored in the chronological list of laser diode characteristic parameters.

10. A method of operating a laser diode, comprising:
    outputting actual drive current values indicative of an actual drive current supplied to the laser diode by a driver circuitry,
    supplying a drive current generated by the driver circuitry to the laser diode (LD),
    controlling the driver circuitry in accordance with drive current values read from a lookup table, and
    updating the drive current values associated with the lookup table on the basis of the actual drive current values, the updating of the drive current values providing an updated lookup table, wherein the updating of the drive current values associated with the lookup table is based on an actual convergence time of a closed-loop control circuit of the driver circuitry, the closed-loop control circuit regulating the drive current to the laser diode.

11. The method of claim 10, wherein the act of updating updates the drive current values associated with the lookup table over a lifetime of the laser diode (LD).

* * * * *